United States Patent [19]

Jasper

[11] 4,127,226
[45] Nov. 28, 1978

[54] COMBINED KERFING AND JOINT NAILING MACHINE

[76] Inventor: Lane Jasper, 165 N. Catalina Ave., Pasadena, Calif. 91101

[21] Appl. No.: 842,944

[22] Filed: Oct. 17, 1977

[51] Int. Cl.² .............................................. B27M 1/08
[52] U.S. Cl. .................. 227/69; 144/309 L; 227/30; 227/148
[58] Field of Search ............... 144/5, 85, 89, 90 A, 144/309 L; 227/27, 30, 69, 148

[56] References Cited

U.S. PATENT DOCUMENTS

| | | | |
|---|---|---|---|
| 1,700,683 | 1/1929 | Madsen | 144/309 L |
| 3,734,381 | 5/1973 | Blevio | 227/148 |

*Primary Examiner*—Howard N. Goldberg
*Assistant Examiner*—Paul A. Bell
*Attorney, Agent, or Firm*—Lawrence Fleming

[57] ABSTRACT

A woodworking machine for fastening together wood picture frames, cabinet doors, case goods, and the like, with joint nails driven into sawed kerfs. The machine combines the two operations of sawing the kerfs and inserting the joint nails. Workpieces to be joined are clamped to movable fixtures. Actuators move the workpiece fixtures apart to permit the entry of a rotary kerfing saw to cut kerfs in the facing surfaces to be joined. Other actuators move the kerfing saw into position and into the workpieces to cut the kerf, then withdraw the saw and move it back into a retracted position out of the way. The workpiece fixtures are then moved to bring the workpieces together so that the sawed kerfs become a single kerf ready to receive a joint nail. The workpiece fixtures may also move the workpieces forward, up to the nailing head. The nailing head then pushes a joint nail into the kerf, fastening the workpieces together. Since both operations are performed on the same workpieces, the kerfs may be located precisely with relation to the outer surfaces, providing improved alignment in the product in addition to a saving in labor.

12 Claims, 18 Drawing Figures

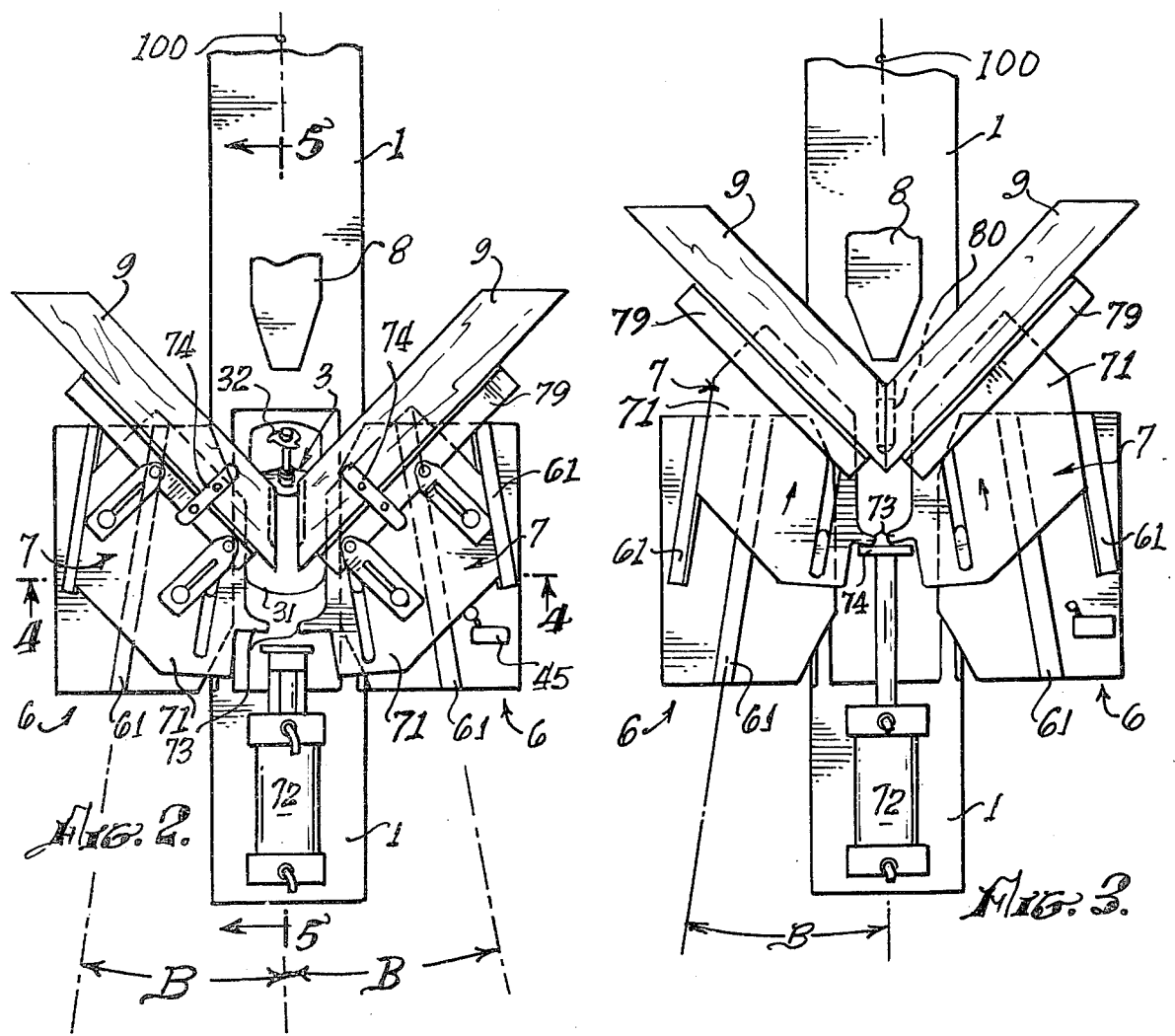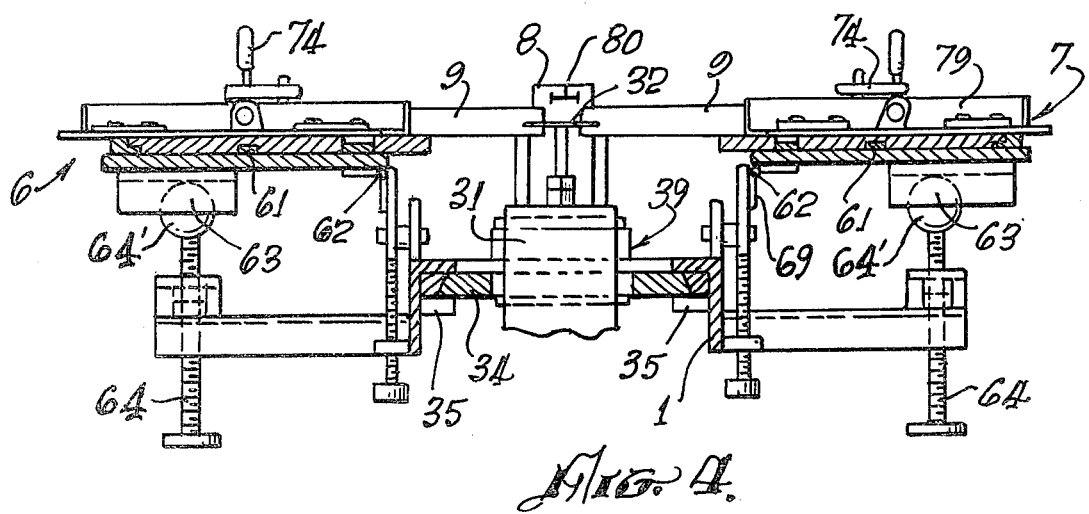

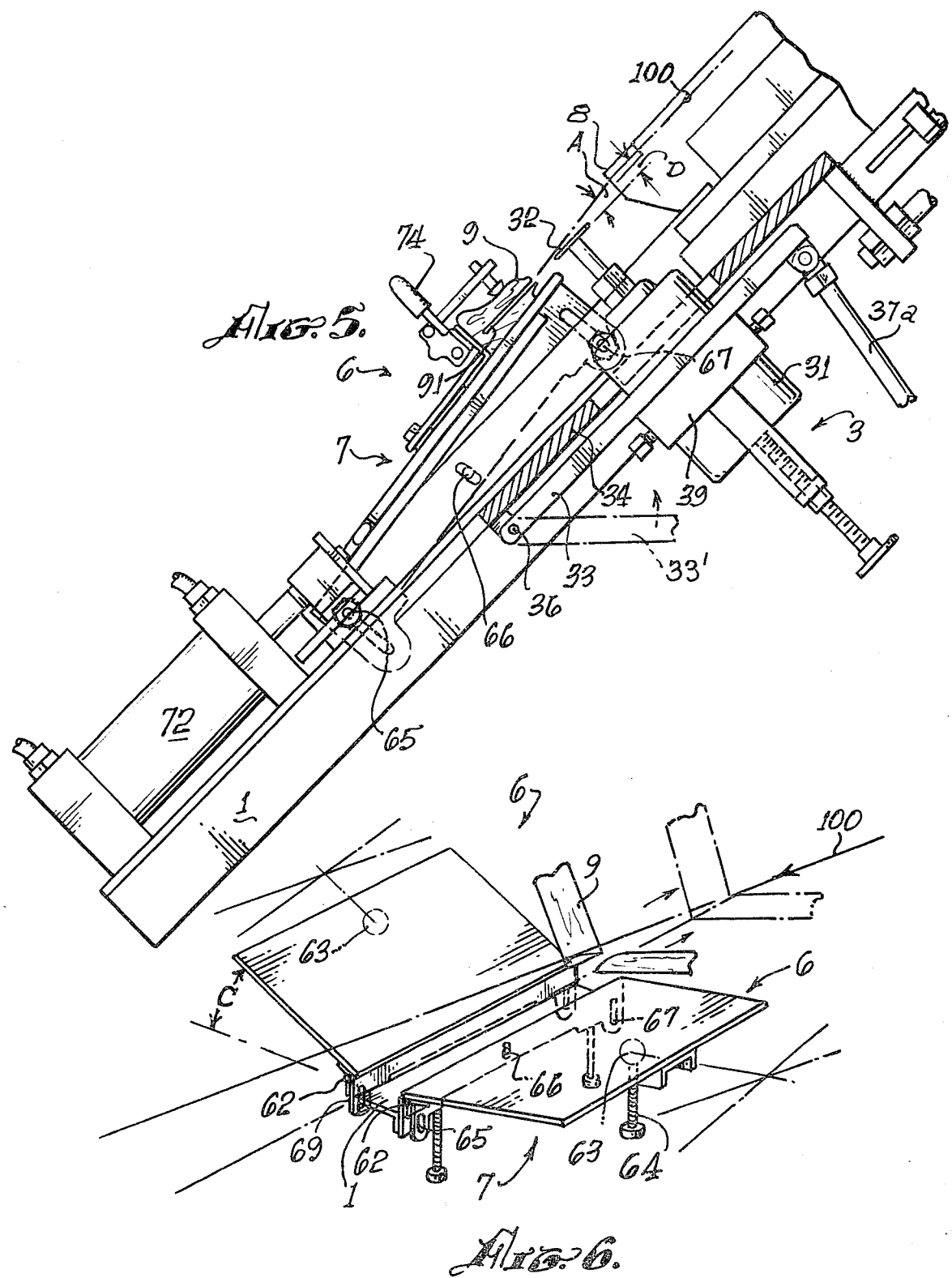

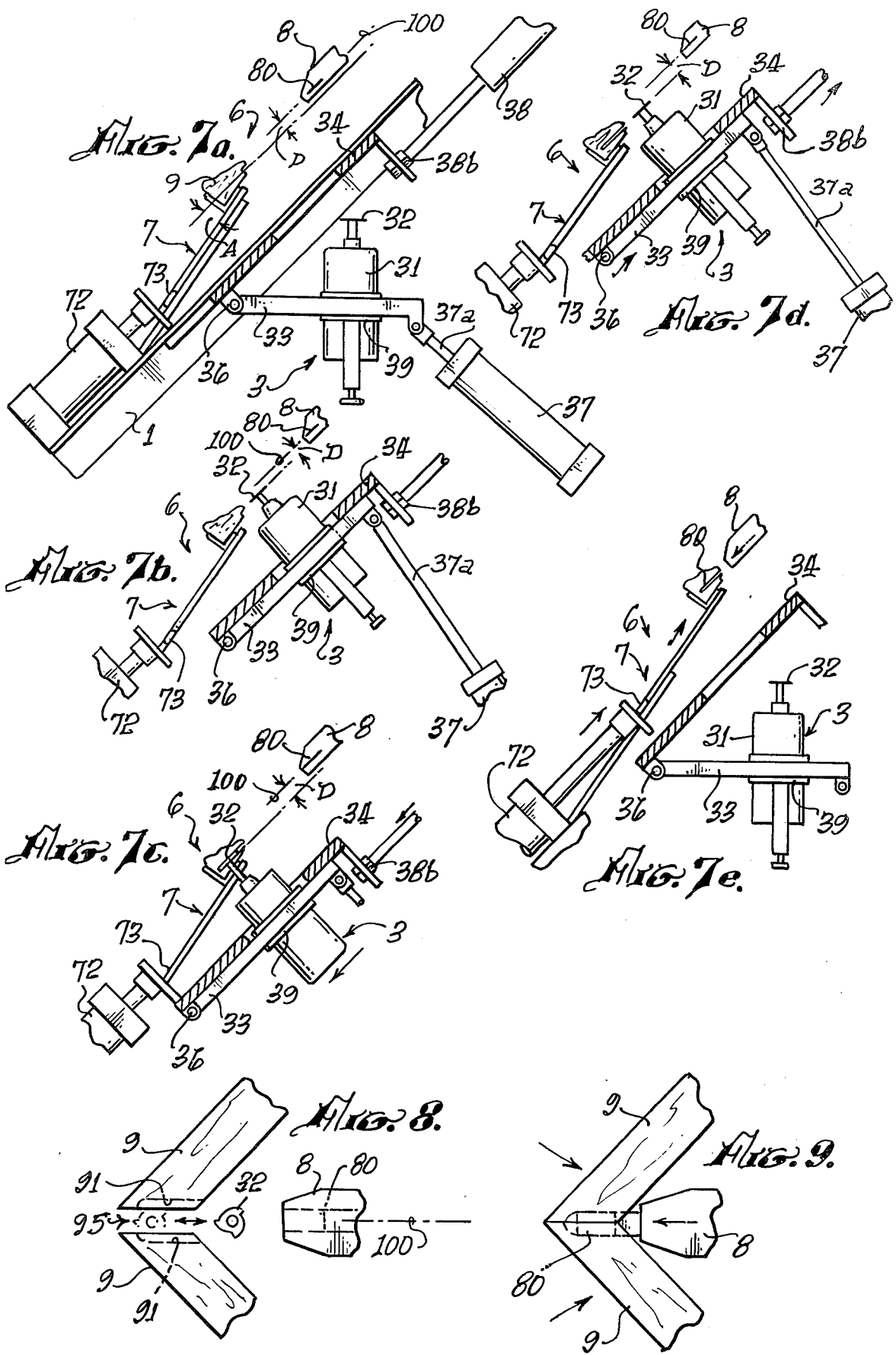

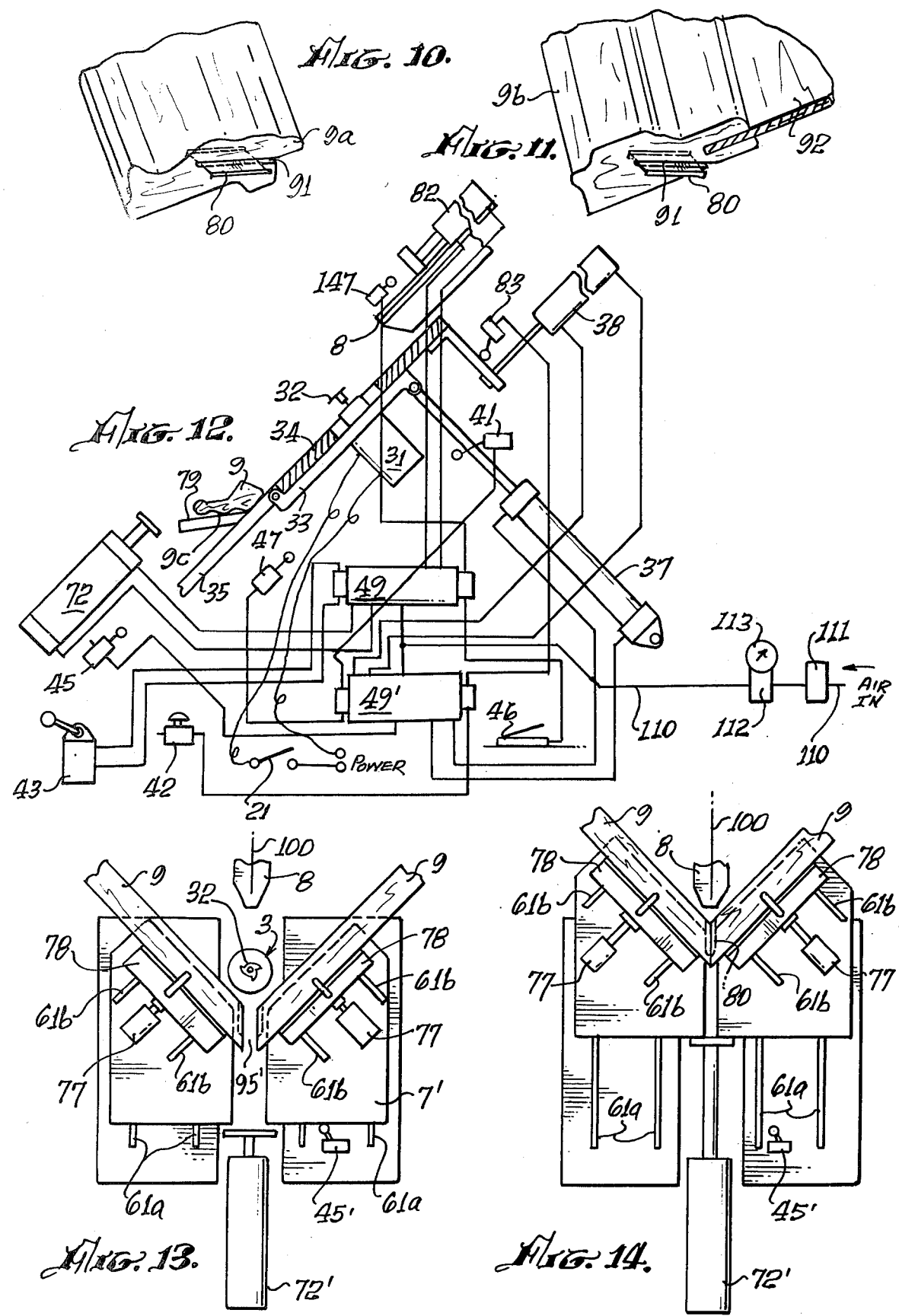

COMBINED KERFING AND JOINT NAILING MACHINE

BACKGROUND

1. Field of the Invention

This invention relates to semi-automatic woodworking machinery, in particular to machines for making miter joints, angle joints, or butt joints by means of joint nails as in the manufacture of picture frames, cabinet doors, door and screen frames, case goods, and deck assemblies.

Joint nails are widely used in the woodworking industry. They typically range from about 9.5 to 17.5 mm wide and from about 1.6 to 6.3 cm long, having a cross-section like that of a narrow I-beam. They are slightly tapered. The edges are sharp, and one end is sharp. Such joint nails, also called clamp nails, are driven into kerfs which are sawed into the surfaces to be joined.

Prior practice in furniture and picture-frame factories is to clamp the workpieces in a kerfing machine, the surfaces to be joined being separated a cm or so to clear the saw shaft and permit the entry of a kerfing saw. The saw is a small-diameter (e.g., 3 cm), high-speed rotary saw mounted on the shaft of an electric motor. The saw, or the work, is then moved in translation to cut the kerf in both workpieces at once. Kerfed workpieces are then moved in batches to a nailing machine. Here they are clamped with their kerfed surfaces in contact-- making a single kerf-- and a nailing head inserts a joint nail in the kerf, fastening the two workpieces together.

It is not economic to keep together the pairs of workpieces that were kerfed together; hence, the batches transferred to the separate nailing machine are random. Due to manufacturing variations in the thickness of workpiece stock, the outer surfaces of random pairs of nailed pieces are usually not precisely even, because the joint nails line up the kerfs, not the front or outer surfaces of the pieces. On occasion, the unevenness is great enough to cause rejects.

If, however, pairs of workpieces can be jigged with their outer or front surfaces aligned, then kerfed, and the same pieces nailed, the surface alignment will be independent of variations in stock thickness and the quality of the product improved. A combined kerfing and nailing machine can effect this improvement.

2. Prior Art

Separate kerfing machines and nailing machines are well known. My prior U.S. Pat. No. 3,597,142 shows a nailing machine suitable for use as part of the present invention. Other prior patents on joint nailing and nailing machines known to me are U.S. Pat. Nos.:

2,900,635 — O'Kelley — 3/1954
2,947,990 — O'Kelley — 12/1960
2,987,724 — Ferguson — 6/1961
2,991,477 — Hoyle, Jr. — 7/1961

I am not aware of any prior showings of a combined kerfing and nailing machine.

BRIEF SUMMARY

The three principal elements of the combined machine are mounted generally in line along a frame member. The elements are: (1) workpiece tables with movable fixtures to hold the workpieces: (2) kerfing saw, on a movable carriage; and (3) nailing head.

Typically, there is a pair of work tables symmetrically disposed, each with a movable fixture for holding the workpieces to be joined, such as two pieces of picture frame molding. In line with the joint line between the workpieces is mounted a nailing head adapted to feed and drive joint nails into the kerfed joint. For reference purposes in defining the locations and angles of components, an imaginary line along which the nails are driven is herein called a nailing axis.

Between the work tables and the nailing head are mounted ways extending generally along the nailing axis. A carriage is disposed slidably on these ways, and is provided with a retracting saw mount. On this saw mount is attached a rotary kerfing saw. Typically, the saw is a circular saw a few cm in diameter mounted on the shaft of a high-speed electric motor. The retracting saw mount is made so as to be able to move the saw between a kerfing or erect position and a retracted position. In the erect position, the saw is approximately on the nailing axis and in a plane parallel to the axis, ready to cut a kerf in the workpieces. When the carriage moves in feed translation along the ways toward the work, the saw can cut the kerf. In the retracted position, the saw is moved away from the nailing axis, leaving a clear space between the work and the nailing head so that the head can insert a nail into the kerfed joint.

Preferably, the fixtures on the work tables are movable with respect to the tables in a manner to move the workpieces apart and together, and also to move them forward and back along the general direction of the nailing axis. This is preferably accomplished simultaneously by sliding the fixtures along fixture ways which are placed at an angle to the nailing axis.

The structure of the nailing device and head itself does not form a part of the present invention. Preferably, it is of the type which forms and drives nails from a coiled continuous strip of semi-formed nail stock, such as described in O'Kelley U.S. Pat. No. 2,947,990 or my prior U.S. Pat. No. 3,597,142, referred to above.

In the preferred embodiment of the invention, the various motions are driven by air cylinders. Four such cylinders are required: (1) a saw-retractingcylinder mounted on the saw carriage to actuate the retracting mount, which is pivoted; (2) a saw feed cylinder mounted on the machine frame to move the saw carriage in translation; (3) a workpiece fixture actuating cylinder; and (4) a nailing head actuating cylinder. These are controlled by suitable air valves, which include interlocks. Thus, an interlock prevents the saw retractor cylinder and saw feed cylinder from bringing the saw into the erect position and feeding it into the work unless the workpiece fixture actuator is de-energized, i.e., the workpieces are separated. Another interlock prevents the nailing head cylinder from driving a nail unless the workpieces are forward and together.

In the preferred embodiment, the two work tables are disposed symmetrically on the machine frame about the nailing axis and are mounted adjustably to the frame. The adjustments are: (1) rise and fall; (2) pitch angle with respect to the nailing axis; and (3) tilt or "dihedral" angle about the nailing axis.

The frame itself is conveniently made from a length of structural steel channel about 15 cm wide and 2 m long, cut with suitable holes and openings and mounted at an angle, slanting upward and back, on a suitable heavy base.

The fixture ways on the surface of each work table are inclined several degrees toward the nailing axis. The plate-like workpiece fixtures slide on these ways. As the fixtures are moved forward (toward the nailing head), they also move together. In the back or separated position, they are kerfed. After the saw has been withdrawn and retracted out of the way, then the fixture cylinder pushes the fixtures forward and the workpieces together in joined relation, and the nailing head is actuated.

On top of each workpiece fixture plate is provided a set of suitable adjustable stops and brackets and one or more toggle clamps to position and hold the work.

DETAILED DESCRIPTION

In the Drawing:

FIG. 2 is a simplified top view of the work table portion of the machine with the fixtures in separated position, viewed in direction 2—2 of FIG. 1;

FIG. 3 is a view like FIG. 2, but with the fixtures in joined position;

FIG. 4 is an enlarged section on line 4—4 of FIG. 2;

FIG. 5 is an enlarged section on line 5—5 of FIG. 2;

FIG. 6 is a simplified partial perspective view showing the work table adjustments;

FIGS. 7a-7e are mechanical diagrammatic views;

FIGS. 8 and 9 are diagrammatic top views associated with FIGS. 7a-7e;

FIGS. 10 and 11 are partial sectional views of joints in workpieces;

FIG. 12 is a schematic diagram of a pneumatic control circuit; and

FIGS. 13-14 show top views of fixture modifications.

Figure 1:
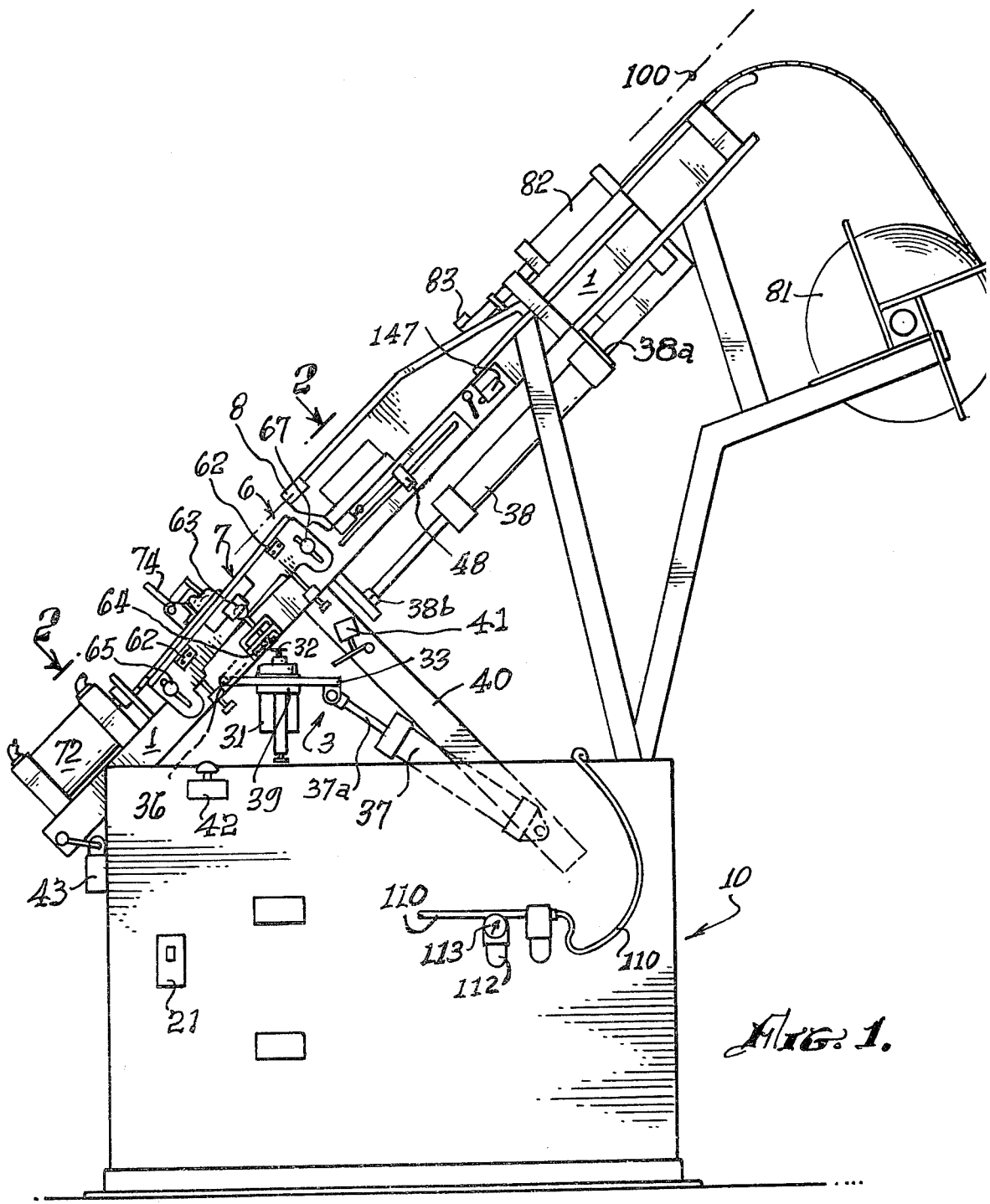
FIG. 1 is a side view of a machine according to the invention.

Referring first to FIG. 1, which shows a side elevation of a complete machine, a frame element 1 is mounted on a suitable heavy base 10, and extends upward at about a 45° angle. While element 1 could be disposed horizontally, the inclination makes operation of the machine more convenient. Frame element 1 may conveniently take the form of a length of structural steel channel stock about 15 cm wide and 1 m long. The principal working elements of the machine are mounted along this element 1. At the upper portion is mounted a joint-nailing head 8, whose details do not form a part of the invention. It may be constructed as in U.S. Pat. Nos. 2,947,990 or 3,597,142, previously referred to. A coil of semi-finished nail strip stock is indicated at 81, from which the nailing head may cut, sharpen, and drive joint nails. (These are also called clamp nails.) Preferably, the head is powered by an air cylinder 82 under the control of valve or pneumatic switch means.

The imaginary line herein termed the nailing axis is defined as the line along which the nails from head 8 are driven. It is approximately parallel to the centerline of the frame member 1, and is indicated at 100 in FIGS. 1, 2, 3, and 5.

Fastened to frame element 1 near its lower or back end is a work table assembly indicated generally at 6, FIGS. 1-6. On top of this assembly is a workpiece fixture assembly indicated generally at 7, FIGS. 1-6. In FIG. 1, element 72 is an actuator for the fixtures, shown also in FIGS. 2, 3, and 5, and described later.

Fastened inside the frame element 1, in between the work table and fixture assemblies 6, 7 and the nailing head 8, is a pair of ways 35, shown in the section of FIG. 4. Slidable in these ways is a saw carriage 34, in a direction parallel to the nailing axis 100 (FIGS. 2-4). Pivoted, or otherwise movably mounted, on saw carriage 34 is a saw carrier 33. See FIGS. 1, 5, and 7a-7e. A saw carrier pivot is shown at 36. Two actuators are provided for the saw. The first actuator 37, with actuating rod 37a, is mounted to the saw carriage 34 via a suitable extension member 40 (FIG. 1). Its function is to move the saw in and out of line with the workpiece, between an erect position and a retracted position. In FIG. 1, the saw is shown in the retracted position; its rotary blade 32 lies below the frame member 1. In the preferred embodiment illustrated, the erection and retraction is accomplished by swinging the saw carrier 33 with respect to its sliding carriage 34 on the pivots 36. In FIG. 5, the saw carrier 33 is shown swung up, the saw 32 in the erect position in line with the workpiece 9, ready to cut a kerf. Obviously, other means, such as sliding ways, may be used instead of the pivot 36 to provide the erecting and retracting displacements of the saw. See also FIGS. 7a-7e.

The second actuator 38 effects translation of the saw carriage 34—and the whole saw assembly—along the saw feed ways 35 (FIG. 5) to feed the saw into the workpieces and withdraw it therefrom. Actuator 38 has a relatively long stroke and is connected between a suitable bracket 38a on frame 1, FIG. 1, and a bracket 38b on the saw carriage 34.

The reason for providing for the retraction of the saw is to prevent its interfering with the insertion of nails 80 into the workpieces 9. See FIGS. 2 and 3.

The workpiece tables and fixtures 6, 7 will now be described. In the preferred embodiment, there is one work table 6 on each side of the frame member 1, FIGS. 2-4. Each table 6 is adjustable in "dihedral" angle C with its outer end tilted up. This may be effected by providing hinges 62 where the tables join the frame, FIG. 4, and providing suitable adjusting screws 64 with ball ends 64′ engaging suitable sockets 63 on the underside of each table. In FIG. 4, the "dihedral" angle is zero; an angle C of several degrees is indicated schematically in FIG. 6. One purpose of this adjustment is to provide for joining parts of bevelled picture frames.

Another table adjustment is for "pitch" angle, which may vary from zero to several degrees "uphill". In FIG. 1, it is zero. An upward pitch angle A is indicated in FIG. 5 and in the diagrams of FIGS. 7a-7e.

A suitable means for providing the pitch angle adjustments is shown in FIGS. 1, 5 and 6. The vertically-extending hinged flange portions 69 of the table assembly 6 are provided with slots at 65, 67, through which screws extend to clamp the flange to the frame 1. A central slot 66 rides on a pin fastened to the frame. Both the pitch angle and the absolute height of the table assembly 6 can thus be adjusted by loosening the screws and sliding the table assembly about. Other adjustable mounting means could obviously be employed.

In the preferred embodiment, fixture ways are provided on top of each workpiece table 6. These may be strips of metal with dovetail cross-sections as at 61, FIGS. 2 and 3. They are disposed at angles B, FIG. 3, with respect to the nailing axis 100, so that they tend to converge in the forward direction. The work-holding fixtures themselves slide on these ways. The fixtures, indicated generally at 7, comprise fixture base plates or the like 71 with suitable grooves in their bottoms to engage the ways 61. The workpieces 9 are clamped in suitable fixture means on top of the fixture plates 71 as by toggle clamps 74 (FIG. 4). Suitable such means or work-positioning elements, indicated at 79, are adjustably mounted on the plates 71 and need not be described in detail.

The angle B of the fixture ways is an important feature of the preferred embodiment. As the fixtures 7 are moved back (down, in the views of FIGS. 2-3), away from the nailing head 8, they also move apart, and vice versa. In FIG. 2, they are shown in the apart or separated position. Here they leave room between the workpieces 9 to clear the shaft of the rotary kerfing saw 32, so that the saw can be fed between them to cut a kerf. After the saw is withdrawn and retracted, the fixture plates 71 may be moved up and together, into the "joined" position. The parts are preferably so located that in this joined position the workpieces are in contact with the nailing head 8, ready for the insertion of a nail 80 into the kerf. Angle B is preferably between about 7 and 15 degrees. See also FIGS. 8 and 9.

A single actuator 72, FIGS. 1-3, may serve to move the fixtures between the separated and the joined positions. In FIGS. 2 and 3, a head 74 on the actuator push rod engages suitable lugs or projecting portions 73 on the fixture plates 71 to push them forward and together.

FIGS. 7a-7e, 8, and 9 illustrate the operating cycle in semi-diagrammatic form. In FIG. 7a, at the beginning of the cycle the fixture 7 is back in the "separated" position (as in FIG. 2), and the saw 3 is retracted. In FIG. 7b, the saw 3 has been moved to the "erect" position by its actuator 37 via push rod 37a (FIG. 1). In FIG. 7c, the saw has been fed into the workpiece 9 by actuator 38 (FIG. 1). In FIG. 7d, the saw has completed cutting the kerf and has been withdrawn. In all these FIGS. 7a-7d, the fixture 7 remains in the back or separated position (FIG. 8). In FIG. 7e, the fixture is moved to the forward "joined" position (FIG. 9), up to the nailing head 8 for the insertion of a joint nail 80 into the kerf 91, and saw 32 is retracted below the frame. This completes the cycle. The fixture and work positions in top diagrammatic view are shown in FIGS. 8-9. Space 95 between workpieces 9 in separated position, FIG. 8, is of course absent in FIG. 9.

It will be noted that FIGS. 7a-7e are drawn with the work table 6 inclined at an upward "pitch" angle A. (See also FIG. 5.) As the fixture 7 moves forward toward the nailing head 8, it also rises. The amount of rise is indicated by the distance D in FIGS. 7a-7d. Conversely, the workpiece is a distance "D" lower than the nailing axis 100 when it is in the back or separated position of FIGS. 7a-7d and 8. Accordingly, it is necessary to set the blade 32 of saw 3 a distance D below the nailing axis 100 in order to have the kerf in line with the nailing head when the fixture is advanced to the "joined" position, FIGS. 7e and 9.

Suitable adjusting and locking means for the height of the saw are provided, therefore, for use in setting up the machine. The pitch angle A required will vary with the cross-sectional shape and size of the workpieces. A suitable adjusting means is shown in FIG. 5. The saw motor 31 is held in a clamping collar 39 of suitable design, which is fastened in turn to the saw motor carrier 33.

In FIG. 5, the carrier 33 is shown in part in the retracted position in broken lines at 33'.

Referring now to FIG. 12, a preferred pneumatic control system will be described. The valves and actuators may be considered in two groups: one relating to the motion of the saw 3, and the other to the actuation of the workpiece fixtures 7 and the nailing head 8.

The following controls are provided for the operator:

(a) Electric power switch 21 to the saw motor 31;
(b) Hand valve 42 to initiate motion of saw 3;
(c) Hand valve 43 to workpiece fixture actuator 72; and
(d) Valve 44 to actuate nailing head 8.

Compressed air from a suitable external supply, such as the shop air supply, not shown, comes in through a line 110, indicated at the right-hand portion of FIG. 12. A suitable valve for the main air supply is indicated at 111. The air may then pass through a suitable filter 112, its pressure indicated by a gauge 113. The main air supply line 110 then proceeds to suitable control valves 49, 49'.

The operating sequence is typically as follows. Suitable workpieces 9 are clamped in the fixtures 7, and the saw motor is started by manual switch 21. Then valve 42 is operated. This admits air, via a suitable control valve 49', into actuator cylinder 37, which moves the saw carrier 33 from the retracted to the erect position. The saw carrier 33 hits a valve 41 which admits air to the saw feed actuator cylinder 38, also via control valve 49', which then moves saw carriage 34 along ways 35 to cut the kerf. A kerf limit valve 47 is adjustably positioned to be operated by carriage 34 at the desired depth of kerf. The carriage hits the valve 47, which reverses, via control valve 49', the saw feed actuator cylinder 38, withdrawing the saw. A carriage return limit valve 83 is adjustably positioned, with a one-way operating flap, to be hit by the saw carriage 34 on its return stroke. When hit, valve 83 stops the return stroke and actuates the saw-retracting actuator cylinder in reverse, moving the saw 3 down into its retracted position. This completes the automatic operation of the saw control system.

A safety interlock valve 45 is adjustably positioned to be closed by the work fixtures 7 and is connected so as to admit air into the above saw control system only when the workpieces are in the back or separated position (as in FIGS. 2, 4, 7a-7d, and 8).

The hand valve 43 may now be operated. It admits air, via control valve 49, into the fixture-moving actuator cylinder 72, causing it to move the workpieces to the forward or joined position. The wokpieces 9 have been kerfed and are ready for nailing. The last step is to operate valve 46, which is preferably equipped with a foot pedal. This energizes the nailing head actuator cylinder 82, which pushes a joint nail or clamp nail 80 into the kerf 91. The limit of its stroke, i.e., the desired depth of insertion of the nail (depending on the nail length), is controlled by a nailing stroke limit valve 147. When hit by limit lug 48 (see FIG. 1), this valve reverses the nailing head actuator cylinder 82. The position of limit lug 48 is adjustable along a slot or the like on the machine frame. It must be adjusted to accommodate nails of different lengths.

The operating cycle is now complete, and the workpieces may be removed from the machine.

It will be apparent that the above functions may also be accomplished with hydraulic valves and cylinders, or by electric switches and actuators. The pneumatic components are, however, convenient and readily available, and may operate from a shop air supply.

FIGS. 13 and 14 are simplified top views of an alternative form of the workpiece-positioning portions of the present machine, shown in two positions. Here, two sets of ways 61a, 61b are provided above the workpiece tables 6. Fixture plates 7' slide on ways 61a which run about parallel to the nailing axis 100, moved by actuator 72' in a manner generally similar to the preferred embodiment of FIGS. 2 and 3. The ways 61a of FIGS. 13-14 are not, however, set at a converging angle; hence, the workpieces must be moved apart and together by separate means. Such means are indicated as ways 61b, along which slide work-holding fixtures 78, moved by additional actuators 77. FIG. 13 shows the workpieces 9 in separated position, with space 95', and FIG. 14 shows them in joined position for nailing.

It will be apparent that, within the purview of the invention, the nailing head 8 could be caused to move toward the workpieces instead of moving the workpieces toward the nailing head, although this is considered less practical.

FIG. 10 shows in partial cutaway perspective a half of a joint in a picture frame made of molding 9a, with a joint nail 91 in a kerf 80. FIG. 10 shows the application of the machine to making cabinet doors. Part of the frame portion of the door is shown at 9b, a kerf 80 and joint nail 91 as before, and a door panel 92.

With suitable fixturing, the machine of the invention may be used to make corner miter joints in all types of frames, chairs, benches, and case goods, including braced corner joints and angle joints, and butt joints, including butt joints in decking assemblies.

In fixturing, it is normally preferable to have the front or outer faces of the workpieces aligned by contact with suitable jig or fixture surfaces. In FIG. 12, for example, the front surface 9c of picture frame workpiece 9 is down against a fixture element indicated at 79. The fixture elements 79 being aligned on both fixture plates, the saw 32 will cut the kerf at precisely the same distance back of front surface 9c in each of the workpieces. Since the workpieces are not moved in the fixtures between the kerfing and nailing operations, the nailing head 8 will join the workpices 9 with their front surfaces in precise alignment, providing a product of improved quality.

I claim:

1. A combined kerfing and joint nailing machine comprising:
    an elongated frame element encompassing a nailing axis and supporting generally therealong:
    workpiece tables with holding fixtures thereon to hold workpieces;
    kerfing saw positioning means carrying a kerfing saw; and
    a nailing head; and further comprising:
    fixture actuator means to move said fixtures between a separated position and a joined position;
    saw actuator means to move said saw on said positioning means between an erect position adjacent said axis and a retracted position clear of said axis, and to feed said saw into said workpieces in said erect position to cut kerfs therein;
    nailing head actuator means to cause said nailing head to drive joint nails; and further comprising:
    control means connected to said actuator means and adapted to effect the following sequence of operations:
    (a) move said fixtures to said separated position;
    (b) move said saw from said retracted position to said erect position;
    (c) feed said saw into said workpieces to cut a kerf therein;
    (d) withdraw said saw from said kerf;
    (e) move said saw to said retracted position;
    (f) move said fixtures to said joined position to hold said workpieces in contact; and
    (g) drive a joint nail into said kerf.

2. A machine as in claim 1, wherein:
    said workpiece tables are two in number and symmetrically disposed about said axis, and further comprising:
    a first lockable pivot connection means between each said table and said frame element to set a said table at a pitch angle with respect to said axis, and
    a second pivot connection means to set said tables at dihedral angles with respect to a horizontal plane passing through said axis.

3. A machine as in claim 2, further comprising:
    fixture means on each said table inclined toward said axis at angles of less than about 20° and slidably supporting said fixtures to guide them in inclined paths forward and together to said joined position and back and apart to said separated position.

4. A machine as in claim 3, wherein:
    said fixture actuator means is a linear actuator directed approximately generally along said axis and having a head means engaging points on each said fixture to move both said fixtures simultaneously along said ways.

5. A machine as in claim 4, wherein said saw positioning means comprises:
    saw carriage ways along a portion of said frame element;
    a saw carriage slidable on said ways generally along the direction of said axis;
    a saw carrier mounted on said carriage movably with respect thereto between said retracted position and said erect position; and
    an adjustable saw mount on said carrier.

6. A machine as in claim 5, wherein:
    said saw carrier is pivoted to said carriage, and
    said saw actuator means comprises a first linear actuator connected between said carrier and carriage, and a second linear actuator connected between said carriage and said frame element,
    said first actuator moving said saw between said erect and retracted positions, and
    said second actuator feeding said saw into said workpieces, and
    said saw mount providing a lockable adjustment of the height of said saw along its axis.

7. A machine as in claim 6, wherein:
    said nailing head is fastened to said frame element at a point near and facing the kerf in said workpieces when they are in said forward and joined position,
    said fixtures, when back in said separated position, leaving room for said saw to pivot into said erect position to cut said kerf.

8. A machine as in claim 2, wherein said control means comprises:
    interlock means permitting motion of said saw into said erect position only when said fixtures are in said separated position.

9. A machine as in claim 7, further comprising:
    a nailing actuator in operable connection with said nailing head;
    a control valve in controlling connection to said nailing actuator; and
    valve-engaging lug means on at least one of said fixtures disposed adjustably to engage and open said valve when said fixture is in said forward joined position.

10. A machine as in claim 5, wherein said saw in said retracted position is positioned below said frame element.

11. A combined kerfing and joint nailing machine comprising:

a frame encompassing a nailing axis;

work table means and lockable pivot connections therefrom to said frame and disposed to permit inclination of said table means at both a pitch angle and a dihedral angle with respect to said axis;

fixtures supported movably on said work table means and having work-holding means to hold workpieces to receive kerfs and joint nails;

means to move said fixtures between a separated position and a joined position to separate said workpieces for kerfing and to hold them in contact for reception of a nail in said kerf;

a nailing head on said frame positioned to drive a said joint nail into a said kerf;

a saw mount carrying a kerfing saw;

means to move said mount between a retracted position and an erect position;

saw feed means to move said mount generally along the direction of said axis in the plane of said saw; and actuation and control means to move said saw mount to cut a said kerf while said fixtures are in the said separated position, and to actuate said nailing head when said mount is in said retracted position and said fixtures are in said joined position.

12. A machine as in claim 11, wherein:

said work-holding means comprises holding elements adapted to contact the exposed surfaces of said workpieces and maintain said surfaces in alignment, whereby said workpieces, when kerfed and joined by a said nail, will present said outer surfaces in accurate alignment.

* * * * *